(12) United States Patent
Werner et al.

(10) Patent No.: US 8,631,376 B2
(45) Date of Patent: Jan. 14, 2014

(54) METHOD AND SYSTEM FOR GENERATING A PLACEMENT LAYOUT OF A VLSI CIRCUIT DESIGN

(75) Inventors: Tobias Werner, Weil im Schoenbuch (DE); Anthony Parent, South Burlington, VT (US); Raphael Polig, Dietikon (CH); Alexander Woerner, Boeblingen (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/342,228

(22) Filed: Jan. 3, 2012

(65) Prior Publication Data

US 2012/0174051 A1    Jul. 5, 2012

(51) Int. Cl.
*G06F 17/50* (2006.01)
(52) U.S. Cl.
USPC .......................... 716/122; 716/118; 716/119
(58) Field of Classification Search
USPC .......................... 716/118–119, 122
See application file for complete search history.

(56) References Cited

U.S. PATENT DOCUMENTS

| 7,082,595 | B1 * | 7/2006 | Chan et al. | 716/119 |
| 7,669,160 | B2 * | 2/2010 | Furnish et al. | 716/119 |
| 8,230,377 | B1 * | 7/2012 | Fang et al. | 716/124 |
| 2007/0204252 | A1 * | 8/2007 | Furnish et al. | 716/10 |
| 2008/0216040 | A1 * | 9/2008 | Furnish et al. | 716/10 |

* cited by examiner

*Primary Examiner* — Stacy Whitmore
(74) *Attorney, Agent, or Firm* — Cantor Colburn LLP; Daniel Schnurmann (57) ABSTRACT

A method and a system for generating a placement layout is disclosed. The method includes receiving one or more user provided schematic with circuit data, placement parameters of circuit elements, default values, and user specified function calls and variables for calculating placement parameters; evaluating variables and function calls to discrete placement parameters; evaluating justification values and adjusting relative parameter values; calculating absolute placement coordinates for all cells from relative placement parameters for each instance; adjusting placement coordinates for alignment options; and generating a layout/hierarchical layout with placement circuit elements based on the calculated absolute placement coordinates.

14 Claims, 8 Drawing Sheets

| CORE2 | DEC2 | CORE4 |
| BSYS1 | CTRL | BSYS2 |
| CORE1 | DEC1 | CORE3 |

METHOD AND SYSTEM FOR GENERATING A PLACEMENT LAYOUT OF A VLSI CIRCUIT DESIGN

FIELD OF THE INVENTION

The present invention relates in general to the field of VLSI circuit design and more particularly, to a method and a system for generating a placement layout thereof.

BACKGROUND AND RELATED ART

Generally, a placement layout of circuits of a custom VLSI circuit design is created following the completion of the design. The placement can be achieved either graphically or by way of a unique placement routine for each design, e.g., a Cadence Skillcode based routine. If the circuit placement is done graphically, it usually takes a designer some effort to ensure current placement ground rules. Furthermore, if an update is required on either the device size or the topology of the schematic, the placement in the layout must be redone manually. Area, size and form factor of the design are estimated based on the floorplan, the total device width of the schematic, and projected wiring tracks required to route the design. The skill code driven placement usually requires customized functions and hard coded instance names, thereby demanding distinct coding efforts for each macro placement. This provides limited scalability and extensibility, making entries of engineering changes difficult.

In the US Patent Publication No. 7,082,595 to Chan et al., a physical device layout is described providing a schematic that includes circuit data, placement parameters, and defaults. Further inputs include a definition of cell physical position in the horizontal direction, a definition of the cell vertical stacking level, a definition of the cell orientation, a specification of vertical alignment of multiple cell instances, and a definition of vertical spacing between two adjacent cell instances. These input parameters are used to generate a layout with the placement circuit elements.

In the US Patent Publication No. 7,350,174 to Srinivasan et al., a layout synthesis of regular structures using relative placement is described, according to the disclosed layout synthesis relative placement constraint information is received. The relative placement constraint information indicates a relative placement of a plurality of layout objects with respect to each other, wherein one or more of a plurality of layout objects may be at a different level of the layout hierarchy, than a second plurality of layout objects. The plurality of layout objects is then automatically placement according to the relative placement constraint information.

SUMMARY OF THE INVENTION

In a first aspect of the present invention, a method is provided for generating a placement layout which allows achieving a placement by instance parameter (PIP) schematics for array specific needs without being restricted to array applications.

In one embodiment, a method for generating a placement layout includes receiving a user provided schematic with circuit data, placement parameters of circuit elements, default values, and user specified function calls and variables for calculating the placement parameters; evaluating variables and function calls to discrete placement parameters; evaluating justification values and adjusting relative parameter values; calculating absolute placement coordinates for all cells from relative placement parameters for each instance; adjusting placement coordinates for alignment options; and generating a layout/hierarchical layout with placement circuit elements based on calculated absolute placement coordinates.

In one embodiment, the present invention includes placement parameters having one or more definitions of cell physical positions in the horizontal direction, a fixed horizontal position of a cell, a definition of cell vertical stacking order for each cell, a fixed vertical position of a cell, a definition of a cell orientation for each cell, a specification of vertical alignment of multiple cell instances, and a definition of vertical spacing between two adjacent cells. Further embodiments can also include justification values with at least one of a left, right, top, bottom, and middle directions.

One embodiment includes aligning options specified to one or more of an upward direction and a downward direction, including calculating steps of absolute placement coordinates for all the cells that include decoding the placement parameters and the definitions and extrapolating placement positions from a numeric pattern. Furthermore, an embodiment can include reading sub-macros, leaf cells, gate sizes, PC pitches and bit width information preferably from a design library.

One embodiment includes receiving definitions and parameters preferably from an associated library.

In one embodiment, a system for generating a placement layout includes a user interface for managing I/O functions of the system; a library for storing schematics with circuit data; a data processing engine in electronic communication with the user interface and the library for receiving at least one of a user provided schematic with circuit data, placement parameters of circuit elements, default values, and user specified function calls and variables to calculate placement parameters; evaluating variables and function calls to discrete placement parameters; evaluating justification values and adjusting relative parameter values; calculating absolute placement coordinates for all the cells from relative placement parameters for each instance; adjusting the placement coordinates for alignment options; and generating a layout/hierarchical layout with placement circuit elements based on calculated absolute placement coordinates.

In an embodiment, parameters can include one or more definitions of the cell physical position in the horizontal direction, a fixed horizontal position of a cell, a definition of cells vertical stacking order for each cell, a fixed vertical position of a cell, a definition of a cell orientation for each cell, a specification of vertical alignment of multiple cell instances, and a definition of vertical spacing between two adjacent cells. Alignment options specify at least one of an upward direction and a downward direction. The data processing engine decodes the placement parameters and the definitions and extrapolates placement positions from a numeric pattern during calculating absolute placement coordinates for all the cells. The data processing engine receives one or more sub-macro, leaf cell, gate sizes, PC pitch and bit width information and definitions and parameters from the associated library.

An embodiment of the present invention allows performing PIP schematics for array specific needs without being restricted to array applications. It further allows placing gates in a left, right, top, bottom corner or center line using variables instead of fixed x, y coordinates. More particularly, embodiments are suitable for circuitries having special symmetry requirements, like SRAM-cells.

In an embodiment, the present invention includes placing circuit elements (e.g., gates) of a VLSI circuit with regard to other circuit elements, wherein the distance between circuit elements are specified in accordance with predefined boundaries of the circuit elements.

BRIEF DESCRIPTION OF THE DRAWINGS

The accompanying drawings, which are incorporated in and which constitute part of the specification, illustrate the presently preferred embodiments of the invention which, together with the general description given above and the detailed description of the preferred embodiments given below serve to explain the principles of the invention.

DETAILED DESCRIPTION OF PREFERRED EMBODIMENTS

Figure 1:
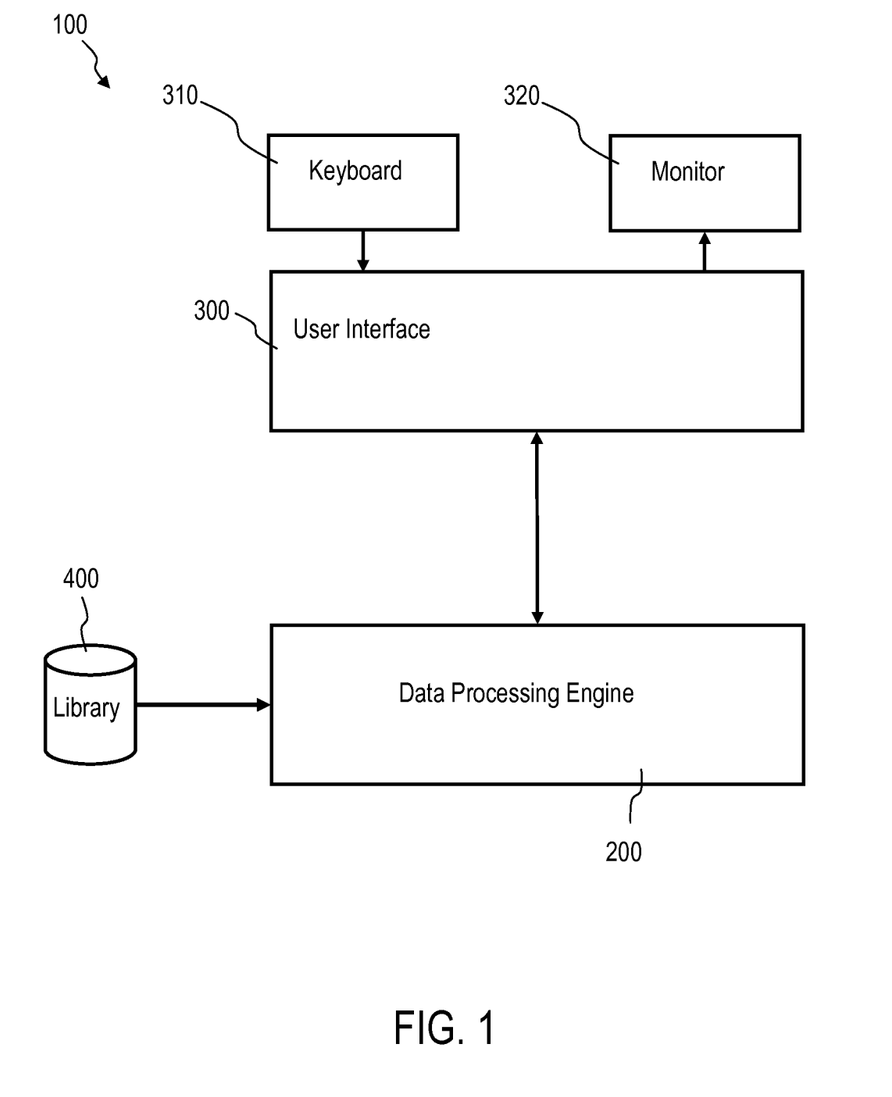
FIG. 1 is a block diagram of a data processing system for generating a placement layout.

Referring to FIG. 1, in one embodiment, data processing system 100 is depicted including data processing engine 200, user interface 300 for managing I/O functions in communication with input unit 310, illustrated as a keyboard, an output unit illustrated as a monitor, and library 400 for storing data and information relevant for generation of a placement layout.

Figure 2:
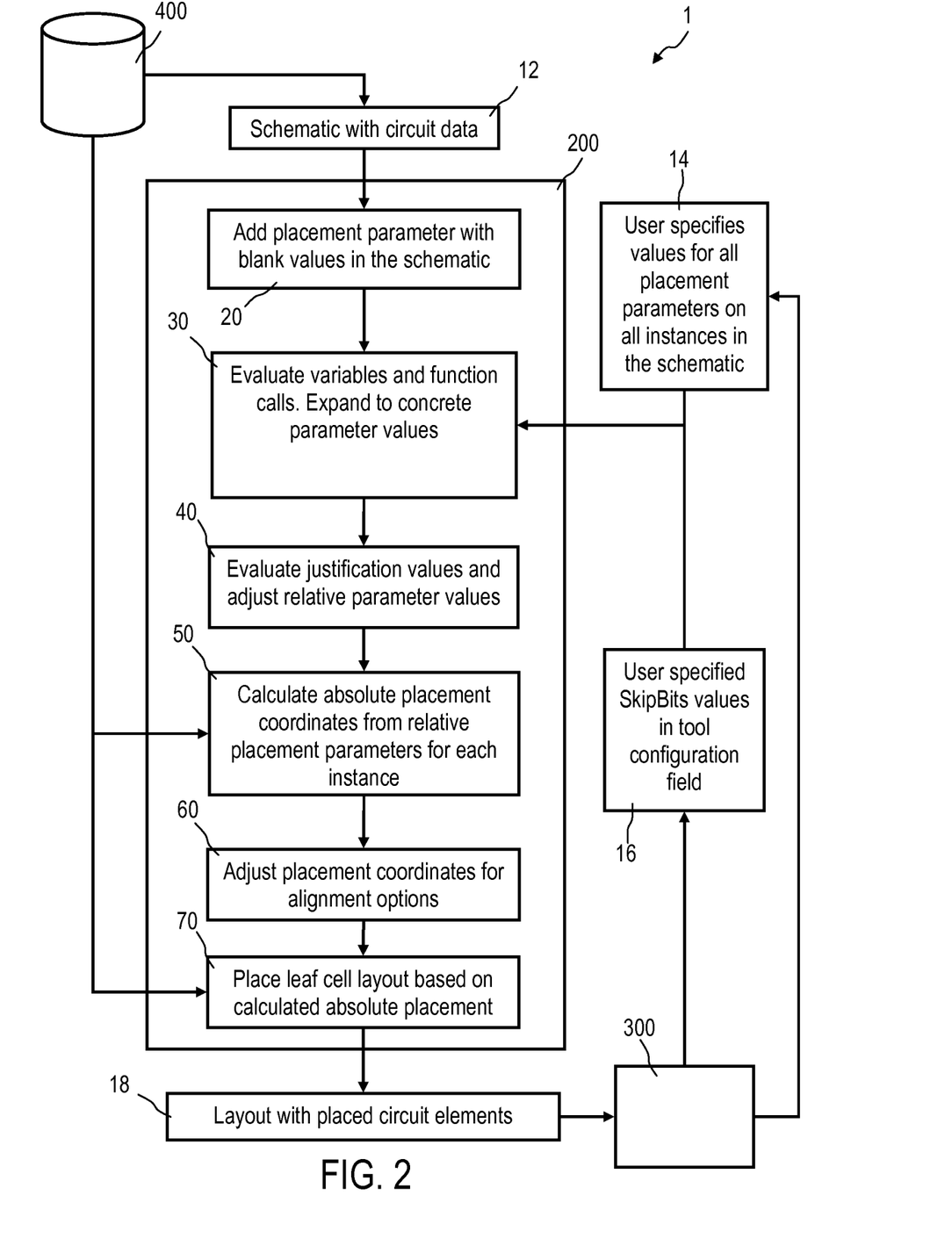
FIG. 2 is a flow chart illustrating a system for generating the placement layout in accordance with an embodiment of the present invention.

Referring to FIG. 2, the data processing engine 200 is shown within an electronic communication with user interface 300 and library 400 receiving one or more user provided schematic with circuit data 12, placement parameters of circuit elements 16, default values, and user specified function calls and variables 14 to compute the placement parameters. The schematic 12 is provided with circuit data from library 400. In block 20, placement parameters are added with blank values and/or with default values to all the instances in schematic 12. The user specifies values for all placement parameters on all the instances in the schematic to define the placement for all the instances of the schematic based on a perceived floorplan in block 14, resulting in a schematic provided with the circuit data and instance placement information. In conjunction, the user also has the option in block 16 to specify values for Skip-bits in the system configuration field to define a bit position to skip over during the calculation of the absolute coordinates for the placement locations of an array of instances.

In block 30, data processing engine 200 evaluates variables and function calls to discrete placement parameter values. Variables are defined, e.g., referenced by a dollar sign ("$") followed by an optional open curly brace, a name, and an optional close curly brace. Variables are referenced by $cellCenter, ${cellCenter}, $CellTop. Functions are delimited, e.g., by curly brace characters "{" and "}" unless prefixed by a "$". Special substitution character sequences similar to the print statement can be replaced by their value. Some example function calls are referenced by {calcSkip % I 5}, and {calcBit % I}. A predefined "special" function called "expr" takes all its arguments and evaluates them as a mathematical expression, i.e., a function call that looks like, e.g., {expr $cellTop+5} or {expr $cellCenter−2}.

In an embodiment, all the parameters can pass through a recursive expansion algorithm similar to a programming language using it in conjunction with placement driven by schematic parameters.

An example is shown that employs the above special function value {expr $cellTop+5} to be described hereinafter. The term {expr $cellTop+5} is recognized as a function call and scanned for needed for further expansion. $cellTop is recognized as a variable. The cellview is queried for a property labeled "cellTop". The value of the property defines the value for the given variable. If it fails, a global skill variable is looked for. (Note: failure here is deemed to be an error). For illustrative purposes, it is assumed that the cellview property cellTop has a value of "10". The function "expr" is recognized as a special mathematical expression function, requiring passing on the expanded mathematical expression ("10+5"). This expression can in turn pass to a skill interpreter and evaluated, with the result ("15") passed back to the data processing engine 200 as the value for the given property.

In another example, the term {calcSkip % I 5} is recognized as a function call and scanned when needed for further expansion. "% I" is recognized as needing a substitution, expanding to the given instance name. A pointer to the given function is obtained similar to the variable values. Cellview is queried for the property of the given name pre-existing definitions that are reviewed. The resultant function pointer is referenced with the arguments expanded. (In such an instance, the term is assumed to be "I25 5"). The function return value is used as the value for the expanded PIP parameter.

In block 40, the data processing engine 200 evaluates the justification values and adjusts the relative parameter values. In this case, it is referred to a given PIP instance parameter relative to the instance below, and does not specify an absolute placement at this time. The calculation of absolute placement coordinates from the relative values of the PIP parameters is part of the pre-existing PIP engine. In block 40, data processing engine 200 looks for extensions such as "L", (left) "R" (right), "T" (top), "B" (bottom), "U" (up), "D" (down). It is assumed for demonstrative purposes that an "R" (right) justification of the bit parameter is selected. The term bit="{calcBit % I 5}R is recognized as a function expression to be evaluated as previously described, and returns a value of "25" corresponding to bit="25R", for instance, following the variable/function expansion.

The data processing engine 200 determines how wide the number of bits is in the given instance. For discussion purposes, let it be assumed to be 5 bits wide. The actual value is calculated to place the right side of the instance in the $25^{th}$ bit, resulting in one less than the actual bit width when starting at the left side of the calculated bit. These results in a "fence post error" if the actual bit width "I" is used. In the case shown, the term becomes 25−4=21. The relative value for the bit parameter is now set to "21". The value thereof is passed to the coordinate engine for an actual placement.

In block 50, the data processing engine 200 obtains submacro or leaf cell sizes, PC pitch and bit width information from the library 400, reads the Skip-Bits values from the system configuration field using the user interface 300, decodes the placement parameter values from all the instances of the schematic, and calculates the absolute placement coordinates for all the instances in the schematic.

In block 60, the data processing engine 200 adjusts the placement coordinates for the alignment options. Block 60 is preferably performed following the initial absolute coordinate calculation. Adjustments are performed to the absolute coordinate values. There are several alignment features, all of which work in a similar manner. Alignment is only performed in the "Level" or "Order" direction, but not in the "Bit" direction. In most cases, this is represented to be the Y direction. Alignment is preferably done using an anchor point and an alignment point. The anchor and alignment points can be one of an upper or a lower edge of an instance, a middle point of an instance, an upper or a lower edge of a pin, a middle point of a pin. In the case of an anchor, the point exists on an already placed cell. In the case of an alignment point, the point exists on the current cell being placed. The absolute placement value is adjusted such that the current cell's alignment point is at the same value as the anchor point.

In block 50, data processing engine 200 places the submacro or leaf cell layout of all the instances in accordance to calculated absolute coordinates of each instance on the layout, and generates a layout/hierarchical layout 18 with placement circuit elements based on the calculated absolute placement coordinates. The data processing engine 200 transfers the layout 18 with placement circuits to the user by way of user interface 300.

Figure 3:
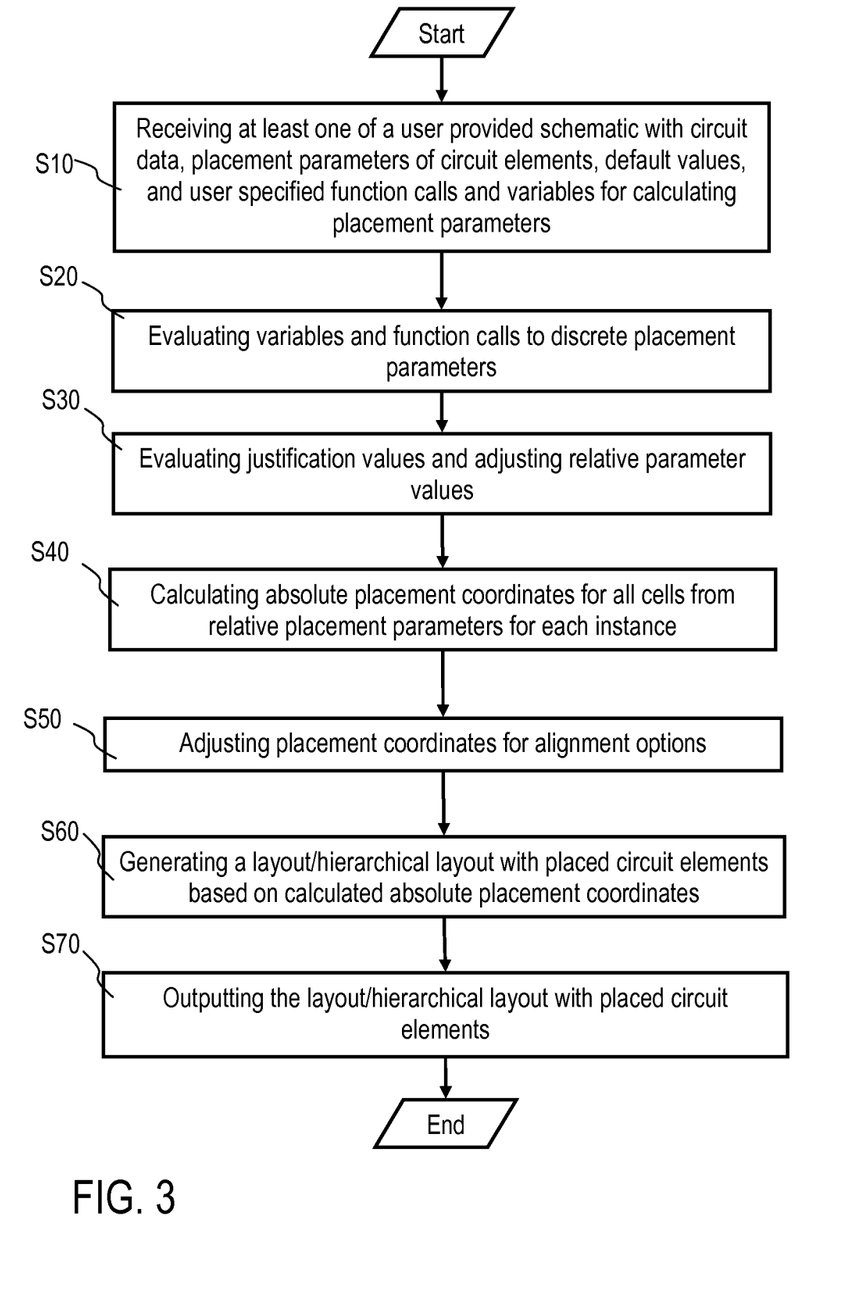
FIG. 3 is a flow diagram of a method for generating a placement layout.

FIG. 3 shows a method for generating a placement layout, in accordance with an embodiment of the present invention. In step S10, one or more user generated schematic provided with circuit data, placement parameters of circuit elements, default values, user specified function calls, and variables for calculating placement parameters are received. In step S20, variables and function calls to discrete placement parameters to be evaluated. In step S30, justification values and adjusting relative parameter values are computed. In step S40, the absolute placement coordinates for all cells are calculated from the relative placement parameters for each instance. During step S50, placement coordinates for alignment options are adjusted. In step S60, a layout/hierarchical layout with placed circuit elements based on the calculated absolute placement coordinates is generated and subsequently outputted in step S70.

Figure 4:
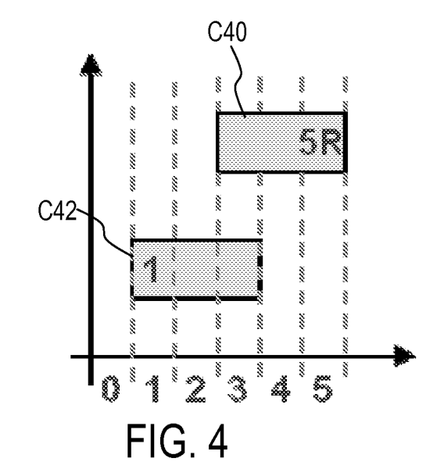
FIG. 4 is a diagram illustrating horizontal instance alignment features.
Figure 5:
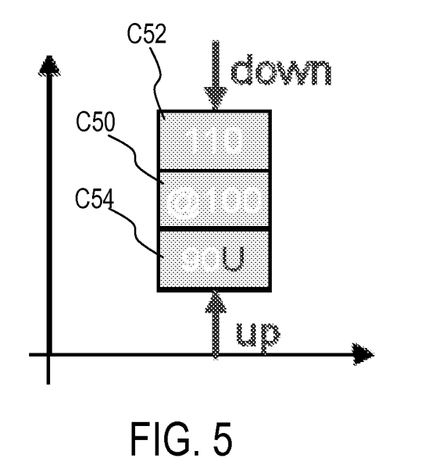
FIG. 5 is a diagram illustrating vertical instance alignment features.
Figure 6:
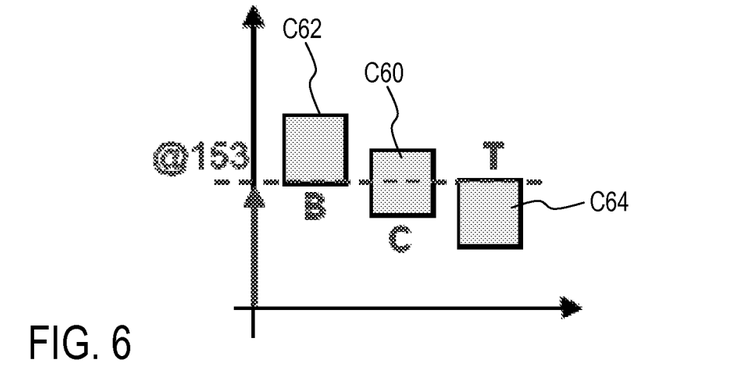
FIG. 6 is a diagram illustrating absolute cell placement features.

FIGS. 4 and 5 respectively illustrate horizontal instance alignment features and vertical instance alignment features, in accordance with an embodiment of the present invention. FIG. 6 illustrates absolute cell placement features. The alignment and/or placement features shown can be used to fulfill the symmetry requirements for the so-called placement by instance parameter (PIP) for SRAM circuits.

Still referring to FIG. 4, the placed instances or cells C40 and C42 are aligned horizontally with a right edge to a bit position or with a left edge to a bit position. In one embodiment, a first instance or cell C40 is shown aligned horizontally with its right edge at the $5^{th}$ bit position labeled and programmed as "5R". In a second instance or cell C42 is aligned horizontally with its left edge at the $1^{st}$ bit position denoted and programmed as "1". As default value, a placeable instance or cell C42 is aligned horizontally with its left edge at a given bit position. Therefore, no further appendix is required to align an instance with the left edge.

Referring now to FIG. 5, placeable instances or cells C50, C52, C54 are aligned vertically to a fixed position, or sinking down on an adjacent instance, or floating up to the adjacent instance. As illustrated therein, a first instance or cell C50 is aligned vertically at a fixed position denoted and programmed by "@100", wherein "@" denotes the fixed status of the first instance or cell C50. A second instance or cell C52 is aligned vertically by sinking down on the adjacent instance or cell C50 and is aligned vertically at a position denoted "110". A third instance or cell C54 is aligned vertically by floating upward to the adjacent instance or cell C50 and is aligned vertically at a position denoted "90U". As default value, the moving instance or cell C52 is aligned vertically, sinking down on a fixed adjacent instance or cell C50. Therefore, no further appendix is required to align vertically an instance or cell by sinking down. For floating upward to the adjacent instance or cell C50 the moving instance or cell C54 is denoted and programmed as appendix "U".

Referring to FIG. 6, placeable instances or cells C60, C62, C54 are aligned vertically to a fixed position, denoted and programmed as @153, with a bottom edge, denoted and programmed with appendix "B", or a top edge denoted and programmed with appendix "T", or with the center denoted and programmed with appendix "C". A first instance or cell C60 is aligned vertically with the middle at a fixed position @153. A second instance or cell C62 is aligned vertically with the bottom edge to the fixed position @153, and a third instance or cell C64 is aligned vertically with the top edge to the fixed position @153.

Figure 7:
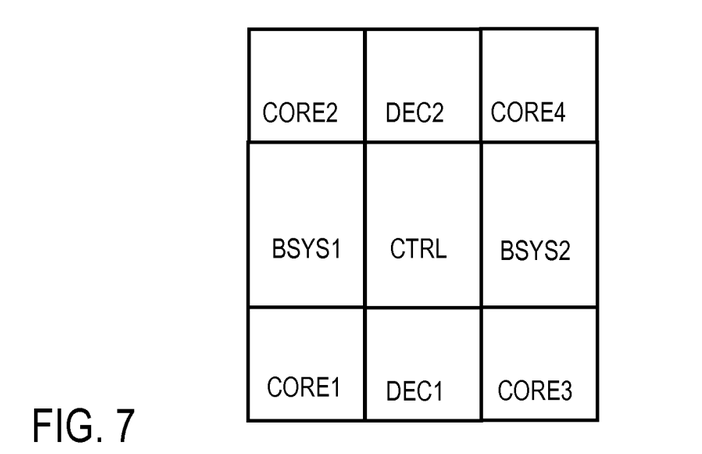
FIG. 7 is an exemplary top-down level layout with placed circuits.

FIG. 7 shows an exemplary schematic top level layout with placement circuits CORE1 to CORE4, BSYS1, BSYS2, DEC1, DEC2, CTRL, and FIGS. 8 to 21 show top-down layouts of sub-cells with different placement circuits CORE1 to CORE4, BSYS1, BSYS2, DEC1, DEC2, DRV1, DRV2, DRV3, and A to F illustrating symmetry specifications of SRAM cells.

Figure 8:
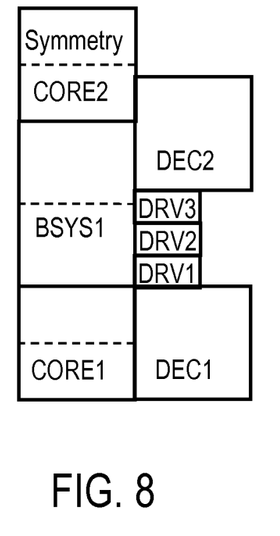
FIGS. 8 to 10 show top-down layouts of sub-cells with placed circuits illustrating a first problem when generating a placed layout using the prior art.
Figures 9, 10:
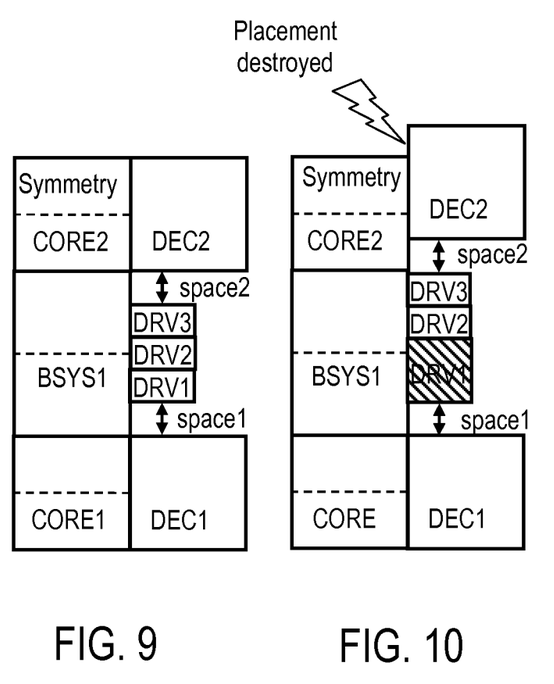
Figure 11:
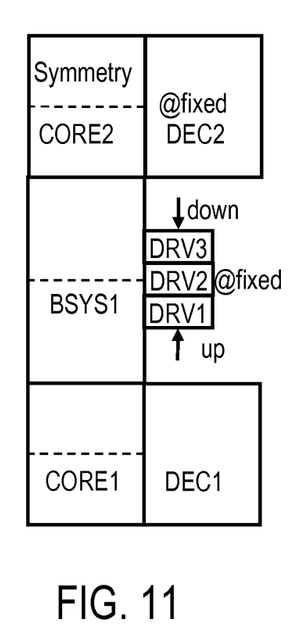
FIGS. 11 and 12 depict top-down level layouts of sub-cells with placement circuits illustrating how the aforementioned first problem shown in FIGS. 8 to 10 when generating the placed layout is solved by way of embodiments of the present invention.
Figure 12:
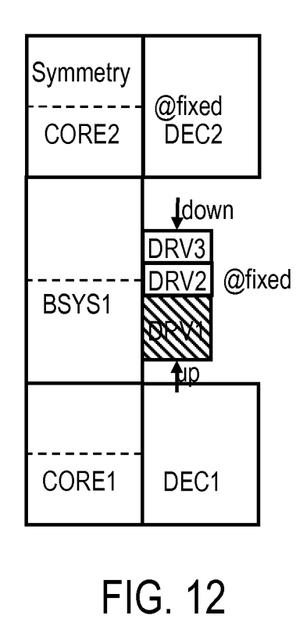

FIGS. 8 to 10 show schematic layouts consisting of placed circuits CORE1, CORE2, BSYS1, DEC1, DEC2, DRV1, DRV2, DRV3, illustrating a first problem occurring when generating a placement layout according to the prior art. Moreover, FIGS. 11 and 12 show schematic layouts consisting of placed circuits CORE1, CORE2, BSYS1, DEC1, DEC2, DRV1, DRV2, DRV3 illustrating how the first problem of generating the placed layout of FIGS. 8 to 10 is solved.

Referring to FIG. 8, there is shown a starting point of aligning vertically a number of instances or cells CORE1, CORE2, BSYS1, DEC1, DEC2, DRV1, DRV2, DRV3. On the left side, tree circuits are placed in the order CORE1, BSYS1, CORE2 from bottom to top, and five circuits DEC1, DEC2, DRV1, DRV2, DRV3 placed in the order DEC1, DRV1, DRV2, DRV3, DEC2 starting from the bottom to the top, adjacent to the already placed circuits CORE1, BSYS1, CORE2.

Referring to FIG. 9, it is assumed that the middle of a first circuit DEC1 is aligned vertically with the middle of the horizontally adjacent placed circuit CORE1. Three circuits DRV1, DRV2, DRV3 are placed as a circuit stack, wherein the center of the middle circuit DRV2 is aligned vertically to the middle of the horizontally adjacent placed circuit BSYS1. Furthermore, the middle of the second circuit DEC2 is to be aligned vertically with the middle of horizontally adjacent placement circuit CORE2. The bottom of the first circuit DEC1 would be aligned to the bottom of the layout. Since circuit CORE1 and DEC1 have the same vertical size, the middle of both are aligned to one another. A first space space1 is programmed to place the circuit pack consisting of the three circuits DRV1, DRV2, DRV3 with space1 vertically apart from circuit DEC1. Space1 is programmed such that the center of the middle circuit DRV2 is aligned with the center of circuit BSYS1. Then, a second space (space2) is programmed to place the circuit DEC2 with space2 vertically apart from the circuit stack, consisting of the three circuits DRV1, DRV2, DRV3. Space2 is programmed in a way such that the center of circuit DEC2 is aligned with the center of circuit CORE2.

Referring to FIG. 10, if the first circuit DRV1 of the circuit stack changes its vertical size, the second and third circuits DRV2, DRV3 of the circuit stack and circuit DEC2 move upward in view of programmed vertical space1, space2, such that the top of the circuit DEC2 moves over the top of the layout and the placement is destroyed.

Referring to FIG. 11, it is likewise assumed that the center of the first circuit DEC1 is to be aligned vertically with the center of the horizontally adjacent placement circuit CORE1, with the three circuits DRV1, DRV2, DRV3 placed in a circuit stack, wherein the center of circuit DRV2 is aligned vertically to the center of the horizontally adjacent placement circuit BSYS1, and the center of the second circuit DEC2 is aligned vertically with the center of horizontally adjacent placement circuit CORE2. The bottom of the first circuit DEC1 is aligned to the bottom of the layout since circuit CORE1 and DEC1 have the same vertical size; the centers of both are aligned to each other. Then, the middle circuit DRV2 is aligned with its center to the middle of the circuit BSYS1 denoted and programmed by "@fixed C". Next, the first circuit DRV1 of the circuit stack floats up to the middle circuit DRV2, and the third circuit DRV3 sinks down on middle circuit DRV2. The center of circuit DEC2 is aligned vertically with the center of circuit CORE2 denoted and programmed by "@fixed C".

If the first circuit DRV1 of the circuit stack changes its vertical size because of the fixed vertical alignment the middle circuit DRV2 of the circuit stack and the circuit DEC2 stay at their vertical position and the placement. The first circuit DRV1 remains vertically aligned to the middle circuit DRV2. The third circuit DRV3 remains vertically aligned to the middle circuit DRV2. Accordingly, the problem is solved by using a fixed placement having the centers of the circuits aligned vertically with respect to the centers of the horizontally adjacent placement circuits.

Figure 13:
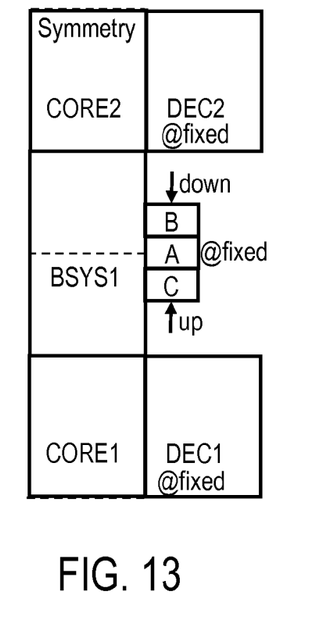
FIGS. 13 and 14 show top-down level layouts of sub-cells with placement circuits illustrating a second problem of generating a placement layout using the prior art, in an embodiment without fixed placement features.
Figure 14:
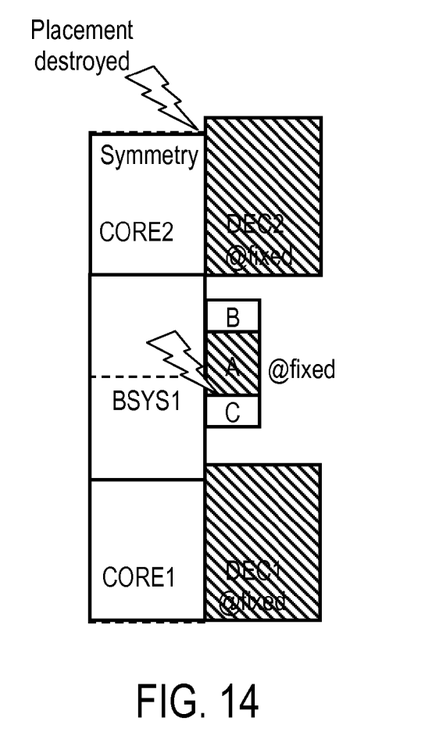
Figure 15:
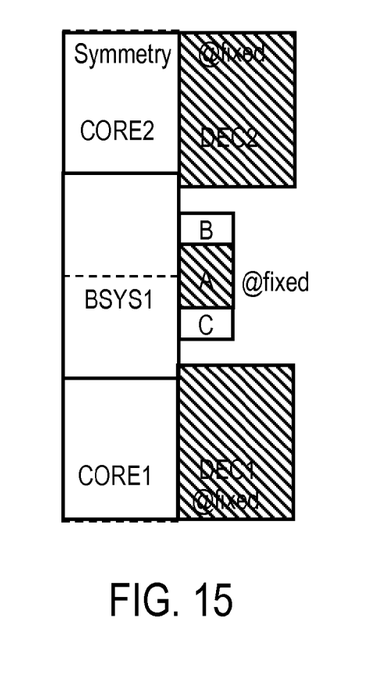
FIG. 15 illustrates a top-down layout of sub-cells with placement circuits illustrating how the aforementioned second problem of generating a placement layout according to an embodiment without fixed placement features shown in FIGS. 13 and 14 is solved when using embodiments of the present invention.

FIGS. 13 and 14 are schematic layouts with placed circuits illustrating a second problem of generating a placement layout according to an embodiment without fixed placement features. FIG. 15 depicts a schematic layout with placement circuits illustrating how the second problem of generating a placement layout of FIGS. 13 and 14 is solved, in accordance with embodiments of the present invention.

FIG. 13 illustrates a starting point of aligning vertically a number of instances or cells CORE1, CORE2, BSYS1, DEC1, DEC2, A, B, C. On the left side, tree circuits are placed in the order CORE1, BSYS1, CORE2 from bottom to top, and five circuits DEC1, DEC2, A, B, C to be placed in the order DEC1, C, A, B, DEC2 from bottom to top, adjacent to the already placed circuits CORE1, BSYS1, CORE2. As illustrated further in FIG. 13, it is assumed, that the first circuit DEC1 is to be aligned vertically fixed relative to the bottom of the layout. The three circuits A, B, C are placed in a circuit stack, wherein the middle circuit A is to be aligned vertically to the middle of the horizontally adjacent placement circuit BSYS1. The second circuit DEC2 is to be aligned vertically top to the top of the layout.

Still referring to FIG. 13, according to an embodiment lacking fixed placement features, the first circuit DEC1 is aligned with its bottom to the bottom of the layout or to the bottom of the horizontally adjacent placement circuit CORE1. The bottom of the middle circuit A of the circuit stack is aligned vertically with a fixed space relative to the bottom or the baseline of the layout, wherein the fixed space is calculated so that the center of circuit A is vertically aligned with the middle of the horizontally adjacent placed circuit BSYS1. The bottom of the circuit DEC2 is aligned vertically with a fixed space relative to the bottom or the baseline of the layout, wherein the fixed space is calculated so that the top of the circuit DEC2 is vertically aligned with the top of the layout.

Referring to FIG. 14, the middle circuit A of the circuit stack is seen changing its vertical size, the top edge of the middle circuit and the second circuit B of the circuit stack moving towards the layout top since the bottom edge of the middle circuit is fixed, so that the middle circuit A and the circuit stack are no longer centered. If it also occurs that the circuit DEC2 changes its vertical size, the top edge of the circuit DEC2 moves over the top of the layout and is no longer vertically aligned to the top, since the bottom edge of the circuit DEC2 is fixed. If it occurs that the circuit DEC1 changes its vertical size, the top edge of the circuit DEC1 will move towards the top of the layout with the bottom edge of the circuit DEC1 still fixed and aligned to the bottom of the layout.

Referring to FIG. 15, it is assumed that the first circuit DEC1 is aligned vertically with its bottom edge to the bottom of the layout, and the three circuits A, B, C are stacked. The middle of circuit A is aligned vertically to the middle of the horizontally adjacent placement circuit BSYS1, and the top of circuit DEC2 is aligned vertically with the top of the layout. According to an embodiment, it is possible to align vertically the bottom of the first circuit DEC1 to the bottom of the layout. The middle circuit A of the circuit stack is aligned vertically to the middle of the horizontally adjacent placement circuit BSYS1. The top of circuit DEC2 is aligned vertically at the same level as the top of the layout.

Still referring to FIG. 15, if the middle circuit A of the circuit stack changes its vertical size, the top edges of the middle circuit A and the circuit B move towards the top of the layout and the bottom edges of the middle circuit A while circuit C moves towards the bottom of the layout so that the center of the middle circuit A remains aligned with the middle of the horizontally adjacent placement circuit BSYS1. Therefore, the middle circuit A and the circuit stack remains centered. If the circuit DEC2 changes its vertical size, the top edge of the circuit DEC2 stays fixed to the top of the layout and is still vertically aligned to the top while the bottom edge of circuit DEC2 moves towards the bottom of the layout. If it happens that the circuit DEC1 changes its vertical size, the top edge of the circuit DEC1 will move towards the top of the layout with the bottom edge of the circuit DEC1 remaining fixed and aligned to the bottom of the layout. Accordingly, the embodiments of the present invention offer fixed placed features relative to top, bottom or middle positions.

Figure 16:
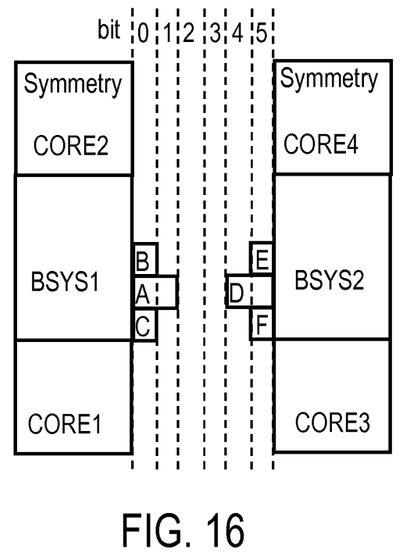
FIGS. 16 and 17 show top-down layouts of sub-cells with placement circuits illustrating a third problem generated by the prior art placed layout.
Figure 17:
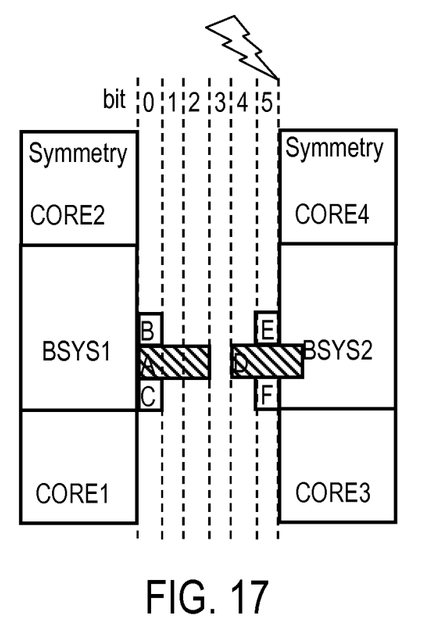
Figure 18:
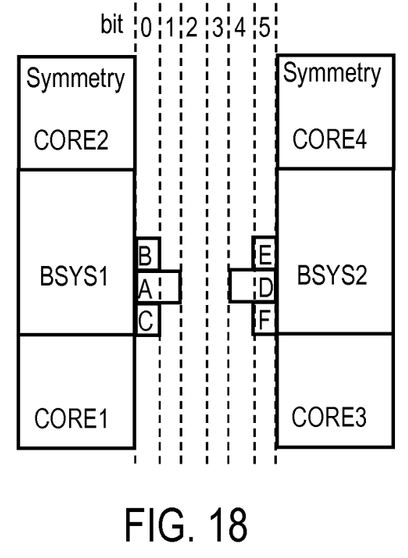
FIGS. 18 and 19 show top-down layouts of sub-cells with placement circuits illustrating how the aforementioned third problem created by a prior art placement layout shown with reference to FIGS. 16 and 17 is now solved when employing embodiments of the present invention.
Figure 19:
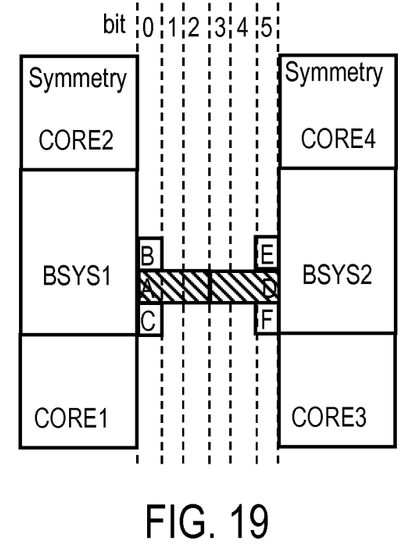

FIGS. 16 and 17 show schematic layouts with placement circuits illustrating a third problem of generating a placement layout existing in the prior art. FIGS. 18 and 19 show schematic layouts with placed circuits illustrating how the third problem of generating a placement layout according of FIGS. 16 and 17 is solved in accordance with an embodiment of the invention.

FIGS. 16 and 18 show starting points of aligning horizontally a number of instances or cells CORE1, CORE2, BSYS1, CORE3, CORE4, BSYS2, A, B, C, D, E, and F. Referring to FIGS. 16 and 18, on the left side tree, circuits are placed in the order CORE1, BSYS1, CORE2 from bottom to top, and the left edges of the three circuits A, B, C horizontally aligned with the right edge of the circuit BSYS1. On the right side of the tree, circuits are placed in the following order CORE3, BSYS2, CORE4 from bottom to top, with the right edges of the three circuits D, E, F horizontally aligned with the left edge of the circuit BSYS2.

Still referring to FIG. 16, according to the prior art, the left edges of the three circuits A, B, C are aligned to the bit position 0 by programming their horizontal position with "0". The left edge of circuit D is aligned to $4^{th}$ bit position by programming the corresponding horizontal position with "4", and the left edges of the circuits E, F are aligned to the $5^{th}$ bit position by programming the horizontal positions with "5".

Referring to FIG. 17, if the middle circuits A and D of the circuit stacks change their horizontal sizes, the right edge of the middle circuit A and the right edge of the middle circuit D of the circuit stacks move to the right, since the left edges of the middle circuits A, D are fixed. The right middle circuit D overlaps the circuit BSYS2 leading to an undesired condition, since the right edge of middle circuit D is no longer aligned any longer to the left edge of circuit BSYS2.

Referring to FIG. 18, the left edges of the three circuits A, B, C are aligned to bit position 0 by programming the horizontal positions with "0". Since placeable instances or cells are aligned horizontally with the left edge to a given bit position as a default value, no further appendix is required for aligning circuits A, B, C to the left edges to bit position 0. The right edges of the three circuits D, E, F are aligned with the $5^{th}$ bit position by programming the horizontal positions as "5R". The appendix "R" needs to be aligned to the right edge of the corresponding circuit D, E, F with a given bit position. Because of the possibility to align circuits with the right edges to bit positions maintenance can be simplified since all the cells are to be aligned with their right edges can now be programmed with the same bit and the appendix "R" without knowing the block width of the corresponding circuits.

Referring to FIG. 19, if the middle circuits A and D of the circuit stacks change their horizontal sizes, the right edge of the middle circuit A of the circuit stack will move to the right since the left edge of the middle circuit A is fixed. Furthermore, the left edge of the middle circuit D of the circuit stack is moved to the left since the right edge of the middle circuit D is fixed. In the present embodiment, no overlapping of circuits occurs compared to the embodiment of FIG. 17 and the right edge of middle circuit D is still aligned to the left edge of circuit BSYS2.

Figure 20:
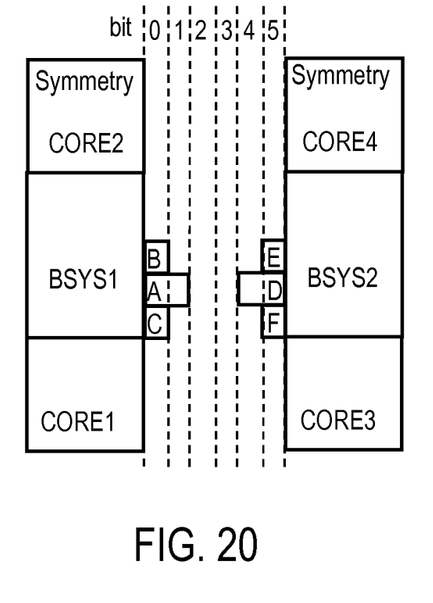
FIGS. 20 and 21 show top-down layouts of sub-cells with placement circuits illustrating how a number of place circuits can be moved in one step, in accordance with an embodiment of the present invention.
Figure 21:
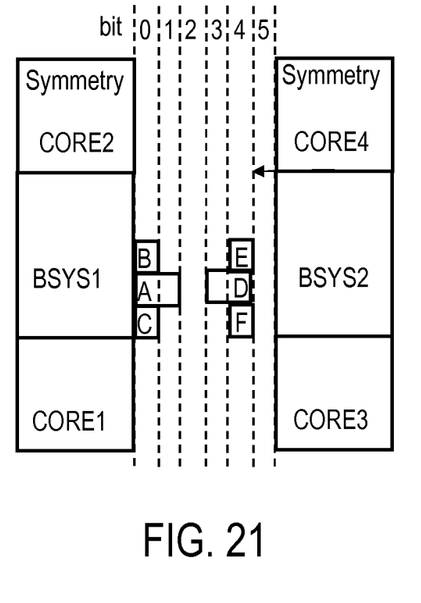

FIGS. 20 and 21 show schematic layouts with placement circuits illustrating how a number of place circuits can be moved in one step.

FIG. 20 shows the starting point of aligning horizontally a number of instances or cells CORE1, CORE2, BSYS1, CORE3, CORE4, BSYS2, A, B, C, D, E, and F. On the left side tree circuits are placed in the order CORE1, BSYS1, CORE2 from bottom to top, and the left edges of the three circuits A, B, C are horizontally aligned with a right edge of the circuit BSYS1. On the right side, tree circuits are placed in the order of CORE3, BSYS2, CORE4 from bottom to top, and the right edges of the three circuits D, E, F horizontally aligned with a left edge of the circuit BSYS2.

Still referring to FIG. 20, according to an embodiment of the invention, the left edges of the three circuits A, B, C are aligned to bit position 0 by programming the horizontal positions with "0", and the right edges of the three circuits D, E, F are aligned to the $5^{th}$ bit position by programming the horizontal positions with "5R", as previously described.

Referring to FIG. 21, if the alignment of the circuit stack with circuits D, E, F is to change and the right edges of the circuits D, E, F are aligned horizontally to the $4^{th}$ bit position. This can be done by changing the programming of the horizontal position of the three circuits D, E, F with "4R", by using function {calculateWidth}R, for example, wherein variable "blockWidth" is changed from "5R" to "4R".

Compared to prior art embodiments, the present invention offer the possibility to specify function calls to calculate any placement parameter. It allows, e.g., to source placement information from an external file, e.g., XML document. Furthermore, the user can indicate schematic variables in expressions that get evaluated to placement parameters, wherein the mentioned placement options get evaluated to discrete placement parameters. Also symmetry requirements can now be expressed by justification extensions like (Left/Right/Top/Bottom/Middle). The extensions get translated into relative expressions. Instead of instances of overlaps occurring, the user has now the option to specify the direction up/down for the placement instances. The resulting coordinate of an instance after alignment gets adjusted during the run of embodiments of the present invention.

Embodiments of the present invention can be implemented as an entirely software embodiment, or an embodiment containing both hardware and software elements. In a preferred embodiment, the present invention is implemented in software, which includes but is not limited to firmware, resident software, microcode, etc.

Furthermore, the present invention can take the form of a computer program product accessible from a computer-usable or computer-readable medium providing program code for use by or in connection with a computer or any instruction execution system. For the purposes of this description, a computer-usable or computer-readable medium can be any apparatus that can contain, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk, and an optical disk. Current examples of optical disks include compact disk-read only memory (CD-ROM), compact disk-read/write (CD-R/W), and DVD. A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution. Input/output or I/O devices (including but not limited to keyboards, displays, pointing devices, and the like) can be coupled to the system either directly or through intervening I/O controllers.

Network adapters may also be coupled to the system to enable the data processing system to become coupled to other data processing systems or remote printers or storage devices through intervening private or public networks. Modems, cable modems, and Ethernet cards are just a few of the currently available types of network adapters.

While the present invention has been particularly described in conjunction of a simple illustrative embodiment, it is to be understood that one of ordinary skill in the art can extend and apply this invention in many obvious ways. Other embodiments of the invention can be adapted thereto. It is evident that many alternatives, modifications and variations will be apparent to those skilled in the art in light of the present description. It is therefore contemplated that the appended claims will embrace any such alternatives, modifications and variations as falling within the true scope and spirit of the present invention.

What is claimed is:

1. A method for generating a placement layout of a VLSI design, comprising;
   using a computer, providing a schematic with circuit data, placement parameters of circuit elements, default values, function calls and variables for calculating said placement parameters;
   evaluating said variables and said function calls to discrete ones of said placement parameters and evaluating justification values and adjusting relative placement parameter values;
   computing absolute placement coordinates for all cells from said respective relative placement parameter values;
   adjusting said placement coordinates for alignment; and
   generating a layout with said placement circuit elements based on said computed absolute placement coordinates.

2. The method according to claim 1 wherein said placement parameters include at least one of said cell physical position in a horizontal direction, a fixed horizontal position of the cell, cells stacked vertically, cells fixed vertical positions, cells orientation, vertical alignment of plural cell instances, and vertical spacing between first and second adjacent cells.

3. The method according to claim 1 wherein said justification values include at least one of a left, right, top, bottom, and middle orientation.

4. The method according to claim 1 wherein said adjusting adjust said placement coordinates using said alignment options specified to at least one of an upward direction and a downward direction.

5. The method according to claim 1, wherein calculating said absolute placement coordinates for all of said cells comprises decoding said placement parameters and extrapolating placement positions from a numeric pattern.

6. The method according to claim 1, further comprising reading at least one of sub-macro, leaf cell, gates sizes, PC pitch and bit width information a design library.

7. The method according to claim 1, comprising receiving placement definitions and parameters from a library.

8. A system for generating a placement layout comprising;
   a user interface (300) for managing input and output functions of said system (1);
   a library (400) for storing schematics with circuit data (12);
   a data processing engine (200) in an electronic communication with said user interface (300) and said library (400) for
   receiving one or more schematic with circuit data (12), placement parameters of circuit elements (16), default values, and predetermined function calls and variables (14) to calculate said placement parameters, evaluating variables and function calls to discrete ones of said placement parameters including evaluated justification values and adjusted relative parameter values,
   calculating absolute placement coordinates for all cells from relative placement parameters for each instance, and
   adjusting placement coordinates for alignment options,
   wherein said placement layout with said placement circuit elements is based on said calculated absolute placement coordinates.

9. The system according claim 8, wherein said placement parameters include at least one of a definition of cell physical position in the horizontal direction, a fixed horizontal position of a cell, a definition for each cell of cells vertical stacking order, a fixed vertical position of a cell, definition of a cell orientation for each cell, a vertical alignment of multiple cell instances, and vertical spacing between two adjacent cells.

10. The system according to claim 8, wherein said justification values comprise at least one of a left, right, top, bottom, and middle orientation.

11. The system according to claim 8, wherein said alignment options specify at least one of an upward direction and a downward direction.

12. The system according to claim 8, wherein said data processing engine decodes said placement parameters and definitions and extrapolates placement positions from a numeric pattern during said calculating absolute placement coordinates for all said cells.

13. The system according to claim 8, wherein said data processing engine receives at least one of sub-macros, leaf cells, gate sizes, PC pitch and bit width information an definitions and parameters from said library.

14. A computer program product stored on a computer-usable storage medium, comprising computer-readable programs for causing a computer to perform a method for generating a placement layout of a VLSI design, the method comprising;
   using a computer, providing a schematic with circuit data, placement parameters of circuit elements, default values, function calls and variables for calculating said placement parameters;
   evaluating variables and function calls to discrete placement parameters, justification values and adjusting relative parameter values;
   computing absolute placement coordinates for all cells from said respective relative placement parameters;
   adjusting said placement coordinates for alignment; and generating a layout of an hierarchical layout with said placement circuit elements based on said computed absolute placement coordinates.

\* \* \* \* \*